United States Patent
Elbaz (10) Patent No.: US 9,560,784 B1
(45) Date of Patent: Jan. 31, 2017

(54) LIQUID TIGHT COVER ASSEMBLY FOR OUTDOOR ELECTRICAL DEVICES

(71) Applicant: Michael Elbaz, New York, NY (US)

(72) Inventor: Michael Elbaz, New York, NY (US)

(73) Assignee: Superflex, Ltd., Brooklyn, NY (US)

( * ) Notice: Subject to any disclaimer, the term of this patent is extended or adjusted under 35 U.S.C. 154(b) by 0 days.

(21) Appl. No.: 14/955,119

(22) Filed: Dec. 1, 2015

(51) Int. Cl.
*H05K 5/06* (2006.01)
*H05K 5/03* (2006.01)
*H02G 3/08* (2006.01)

(52) U.S. Cl.
CPC ............. *H05K 5/061* (2013.01); *H02G 3/088* (2013.01); *H05K 5/03* (2013.01); *H05K 5/06* (2013.01)

(58) Field of Classification Search
CPC .......... H02G 3/14; H02G 3/088; H01H 21/08; H01H 21/085; H01R 13/5213; H01R 13/447
USPC .... 312/328; 220/241, 242, 3.2, 3.3, 3.8, 3.9, 220/3.92, 3.94; 439/136, 143–147, 536; 174/50, 50.51, 520, 67, 66, 53–54, 58, 174/50.5, 50.54
See application file for complete search history.

(56) References Cited

U.S. PATENT DOCUMENTS

| | | | |
|---|---|---|---|
| 2,870,933 A * | 1/1959 | Winter | H01R 13/447 220/242 |
| 3,137,407 A * | 6/1964 | Czeslaw | H01R 13/447 220/242 |
| 3,189,212 A | 6/1965 | Bellek | |
| 3,252,611 A * | 5/1966 | Weitzman | H01H 23/06 174/67 |
| 3,392,228 A * | 7/1968 | Zerwes | H02G 3/088 174/542 |
| 4,058,358 A * | 11/1977 | Carlisle | H01R 13/447 220/242 |
| 4,134,516 A * | 1/1979 | Sullo | H02B 1/066 174/67 |
| 4,342,493 A * | 8/1982 | Grenell | H01R 13/5213 439/142 |
| 4,456,145 A * | 6/1984 | Frank | H02G 3/14 220/242 |
| 4,505,403 A * | 3/1985 | Bowden, Jr. | H02B 1/066 174/67 |
| 4,994,631 A | 2/1991 | Williams | |
| 5,914,460 A * | 6/1999 | Mowery | H02B 1/28 174/17 CT |
| 6,179,634 B1 * | 1/2001 | Hull | H02G 3/185 174/485 |
| 7,462,778 B1 | 12/2008 | Shotey | |
| 7,622,676 B2 | 11/2009 | Drane | |
| 7,728,226 B2 * | 6/2010 | Drane | H01H 21/085 174/66 |

(Continued)

*Primary Examiner* — Dimary Lopez Cruz
(74) *Attorney, Agent, or Firm* — Seth Natter; Natter & Natter (57) ABSTRACT

A cover assembly for an outdoor electrical device includes a base having a rear wall with an adapter plate which surrounds the face of the device. A lid which is hinged to the base includes a front panel having an arched or curved contour. Projecting from the underside of the front panel is a grid of ribs having coplanar proximal edges. The distal face of a gasket seats against the proximal edges and the grid is open in a space behind a breakaway portion of the gasket. In the event the electrical device comprises a toggle switch, the breakaway portion is removed, leaving an opening such that the toggle switch lever can extend into the opening and, if necessary, into the open space, without distorting the proximal face of the gasket which seals against the rear wall when the lid is closed.

20 Claims, 7 Drawing Sheets

(56) References Cited

U.S. PATENT DOCUMENTS

| | | | |
|---|---|---|---|
| 7,851,703 B2* | 12/2010 | Drane | H05K 5/061 174/50 |
| 7,915,528 B2* | 3/2011 | Ni | H01R 13/5213 174/50 |
| 8,314,334 B1 | 11/2012 | Cleghorn | |
| 2011/0211300 A1* | 9/2011 | Mori | G06F 1/1656 361/679.01 |

* cited by examiner

LIQUID TIGHT COVER ASSEMBLY FOR OUTDOOR ELECTRICAL DEVICES

BACKGROUND OF THE INVENTION

1. Field of the Invention

This invention relates generally to outdoor electrical device cover assemblies and more particularly to a cover assembly having an arched lid configured to accommodate toggle switches.

2. Antecedents of the Invention

There exists a wide variety of electrical devices mounted within boxes of electrical systems, e.g., receptacles of different voltage and current capacities, toggle switches, paddle switches, GFCI units, etc., having different sizes and shapes which necessitate device covers dimensioned to accommodate the operative face of each specific device. Covers for devices exposed to weather also required a weather proof lid and, in some instances, a locking mechanism.

While devices such as receptacles are mounted with their operative faces generally flush with a base or rear panel of the cover assembly, devices such as toggle switches include a toggle or lever which projects forwardly of the base. As a result, in use cover assemblies, having enlarged bubble type lids such as those disclosed in U.S. Pat. Nos. 5,280,135 and 5,773,760 were employed to accommodate the toggle or lever. Use of such cover assemblies for toggle switches and the like, which do not require in use openings for electric cords, was generally unsightly and the added bulk of the bubble lid detracted from the outdoor environment in some instances.

Alternately, covers having lids configured for a specific toggle switch were provided, as shown in U.S. Pat. Nos. 3,189,212 and 4,994,631. A further approach, illustrated in U.S. Pat. No. 7,381,895, was to provide a cover assembly having a base with deep peripheral walls and a lid which fit flush with the edges of the peripheral walls. The depth of the peripheral walls was sufficient to accommodate a toggle switch lever. The depth of the cover assembly approximated that of an in use cover and resulted in a bulky appearance.

SUMMARY OF THE INVENTION

A cover assembly for an outdoor electrical device includes a base having a rear wall with an adapter plate which surrounds the operative face of the device. A lid having a front panel with an arched or curved contour is hinged to the base. Projecting from the underside of the curved front panel is a grid of ribs having coplanar proximal edges. The distal face of a gasket seats against the proximal edges and the grid is open in an area behind a breakaway portion of the gasket which is configured for registration with a toggle switch lever. In the event the electrical device comprises a toggle switch, the breakaway portion is removed, leaving an open space such that a toggle switch lever can extend into the space and, if necessary, into the open area of the grid, without distorting the proximal face of the gasket which seals against the rear wall when the lid is closed.

From the foregoing compendium, it will be appreciated that an aspect of the present invention is to provide a liquid tight cover assembly for outdoor electrical devices of the general character described which is not subject to the aforementioned disadvantages of the antecedents of the invention.

A feature of the present invention is to provide a liquid tight cover assembly for outdoor electrical devices of the general character described which is easy to use.

A consideration of the present invention is to provide a liquid tight cover assembly for outdoor electrical devices of the general character described which is well suited for employment in environments under harsh weather conditions.

A further aspect of the present invention is to provide a liquid tight cover assembly for outdoor electrical devices of the general character described which is well suited for economical mass production fabrication.

Another feature of the present invention is to provide a liquid tight cover assembly for outdoor electrical devices of the general character described which is water resistant.

A still further consideration of the present invention is to provide a liquid tight cover assembly for outdoor electrical devices of the general character described having a lid with an arched contour hinged to a base and a gasket within the lid seated against coplanar edges of a grid assembly.

An additional aspect of the present invention is to provide a liquid tight cover assembly for outdoor electrical toggle switches of the general character described having a lid with an arched contour hinged to a base and a gasket within the lid seated against coplanar edges of a grid assembly which is configured to accommodate a lever of the toggle switch.

To provide a liquid tight cover assembly for outdoor electrical devices of the general character described having a lid with an arched contour and a peripheral skirt hinged to a base, a grid assembly having coplanar edges which are parallel to the edges of the skirt and a sealing gasket seated against coplanar edges of a grid assembly is a further consideration of the present invention.

Another aspect of the present invention is to provide a liquid tight cover assembly for outdoor electrical devices of the general character described having a base and an arched lid wherein a gasket is carried within the lid and is seated against a grid.

Other aspects, features and considerations of the present invention in part will be obvious and in part will be pointed out hereinafter.

BRIEF DESCRIPTION OF THE DRAWINGS

In the accompanying drawings, wherein some of the various possible exemplary embodiments of the invention are shown.

DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements.

Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein.

Moreover, applicant does not intend for any term in the specification or claims to be ascribed an uncommon or special meaning unless explicitly set forth as such. Further, the present invention encompasses present and future known equivalents to the known components referred to herein by way of illustration.

Referring now in detail to the drawings wherein like numerals have been employed to denote like components throughout, the reference numeral 10 denotes generally a liquid tight cover assembly constructed in accordance with and embodying the invention. The cover assembly 10 includes a base 12 having a planar rear wall 14 which is configured to be attached to and cover an electrical box which carries an electrical device. An opening 16 in the rear wall 14 is dimensioned to house an adapter plate having an aperture dimensioned to receive the operative face of the electrical device.

Figure 1:
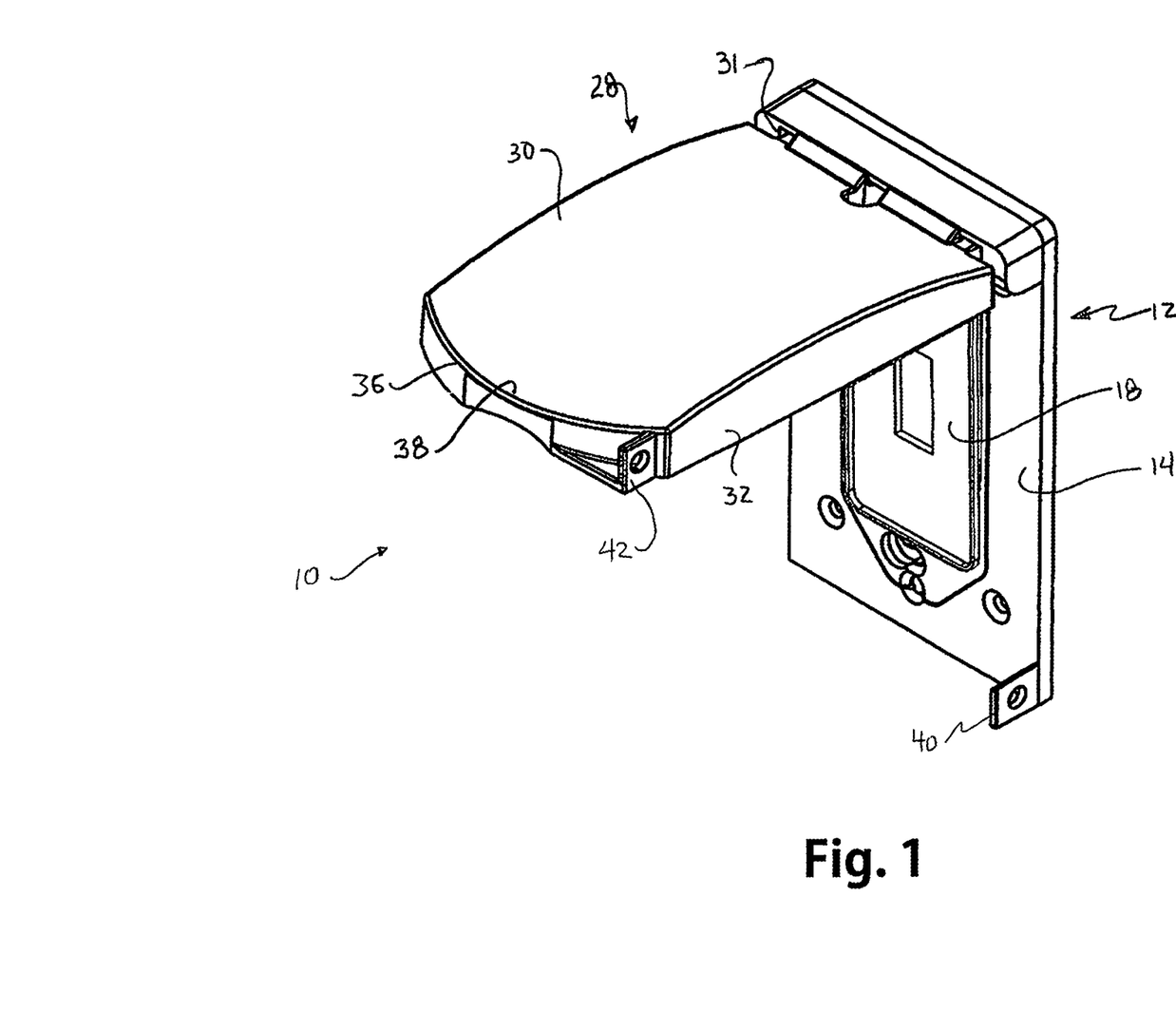
FIG. 1 is an isometric view of an electrical device cover assembly constructed in accordance with and embodying the present invention and showing a lid having a curved front panel hinged to a base and an adapter plate configured for a toggle switch positioned in the base.
Figure 3:
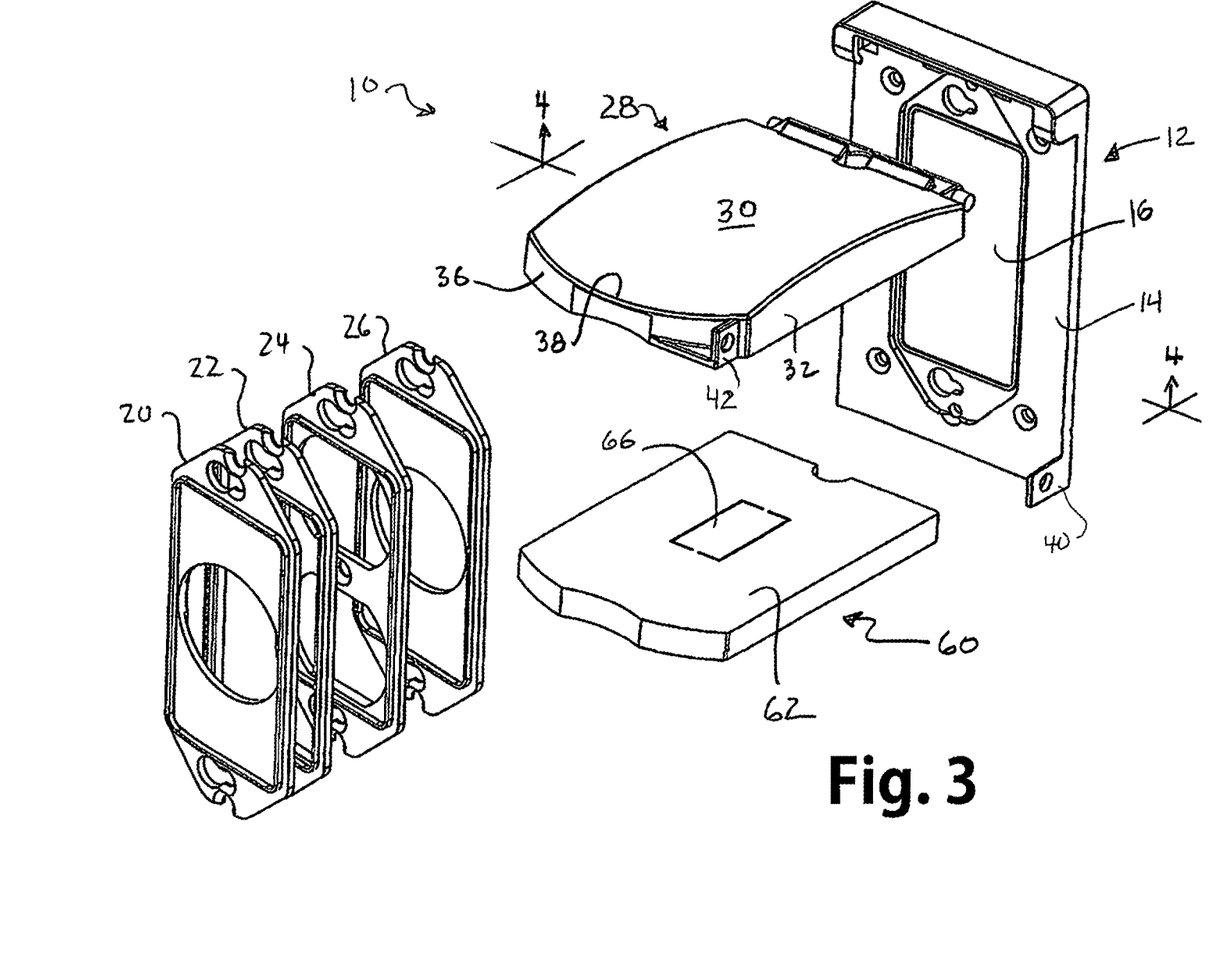
FIG. 3 an isometric exploded view of the cover assembly illustrating the gasket and a plurality of adapter plates.

Illustrated in FIG. 1 is an exemplary adapter plate 18 having an aperture for receiving the lever of a toggle switch. With reference to FIG. 3, it should be noted that the cover assembly may be supplied with several adapter plates 20, 22, 24 and 26, each configured for a different electrical device.

The liquid tight cover assembly includes a lid 28 formed with a front panel 30 having an arched or curved contour. Extending from the peripheral edges of the front panel 30 is a boundary skirt formed of a pair of parallel side walls 32, a rear wall 34, extending transverse to the side walls, and a front wall 36. The curved contour of the front panel 30 comprises a cylindrical wall segment centered about an axis 35, which is perpendicular to the side walls. A portion 38 of the front panel 30 overlaps an indented portion of the front wall 36 to provide a finger grip for opening the lid. A hinge assembly 31 pivotally joins the lid 28 to the base 12. It should be noted that the proximal edges of the boundary skirt are coplanar and, when the lid 28 is closed, generally abut the planar rear wall 14.

A flange 40, projecting from the rear wall 14, is positioned adjacent to a mating flange 42, projecting from the lid front wall 36 when the lid 28 is closed. The flanges 40, 42 include hasp apertures suitable for receiving a padlock shackle to maintain the lid 28 in a closed position and prevent unauthorized access to the electrical device.

Figure 4:
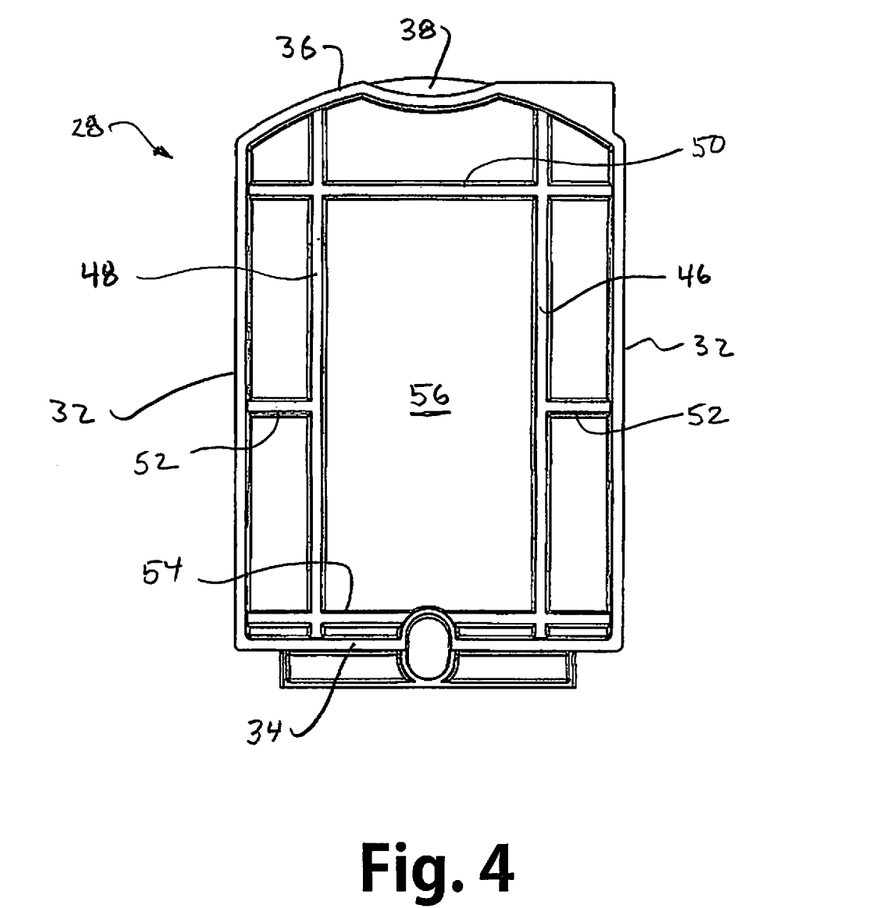
FIG. 4 is an auxiliary view of the lid interior without the gasket, taken substantially along the plane 4-4 of FIG. 3.
Figure 5:
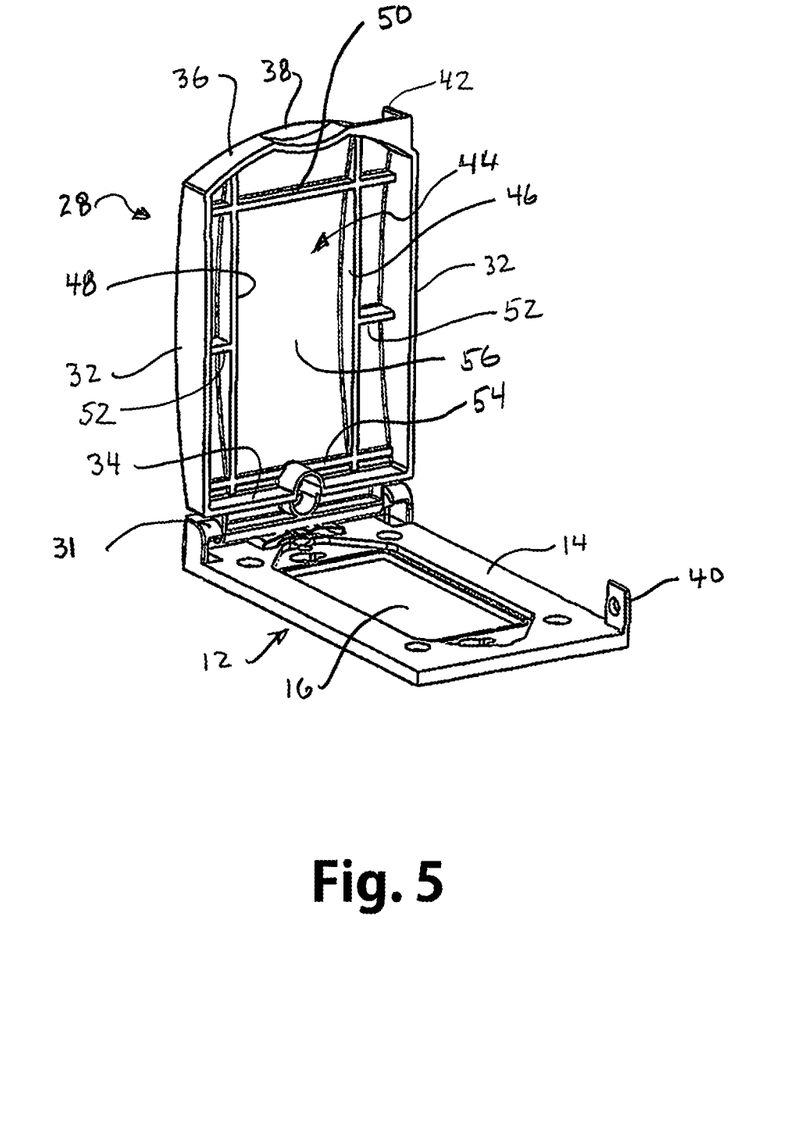
FIG. 5 is an isometric view of the cover assembly with the lid open and without the gasket and showing a grid of ribs extending proximally from the interior face of the curved front panel.

Referring now to FIGS. 4 and 5, it will be observed that an array or grid 44 of planar ribs project from the underside of the curved front panel 30 proximally, i.e., toward the plane of the proximal edges of the boundary skirt. More specifically, a pair of longitudinal ribs 48, 50 extends parallel to the side walls 32 from the front wall 36 to the rear wall 34. The grid 44 also includes a pair of transverse ribs 50, 54 which span between the side walls 32 parallel to the rear wall 34 and which intersect the longitudinal ribs 48, 50. A pair of intermediate ribs 52 is also provided. One intermediate rib 52 extends from a side wall 32 to the longitudinal wall 46, while the other intermediate rib 52 extends from a side wall 32 to the longitudinal wall 48. The grid 44 includes a gap or open space 56 which is free of ribs.

Significantly, the proximal edges of the ribs 48, 50, 52 and 54 lie in a single plane which is parallel to and spaced from the plane of the proximal edges of the boundary skirt.

Figure 2:
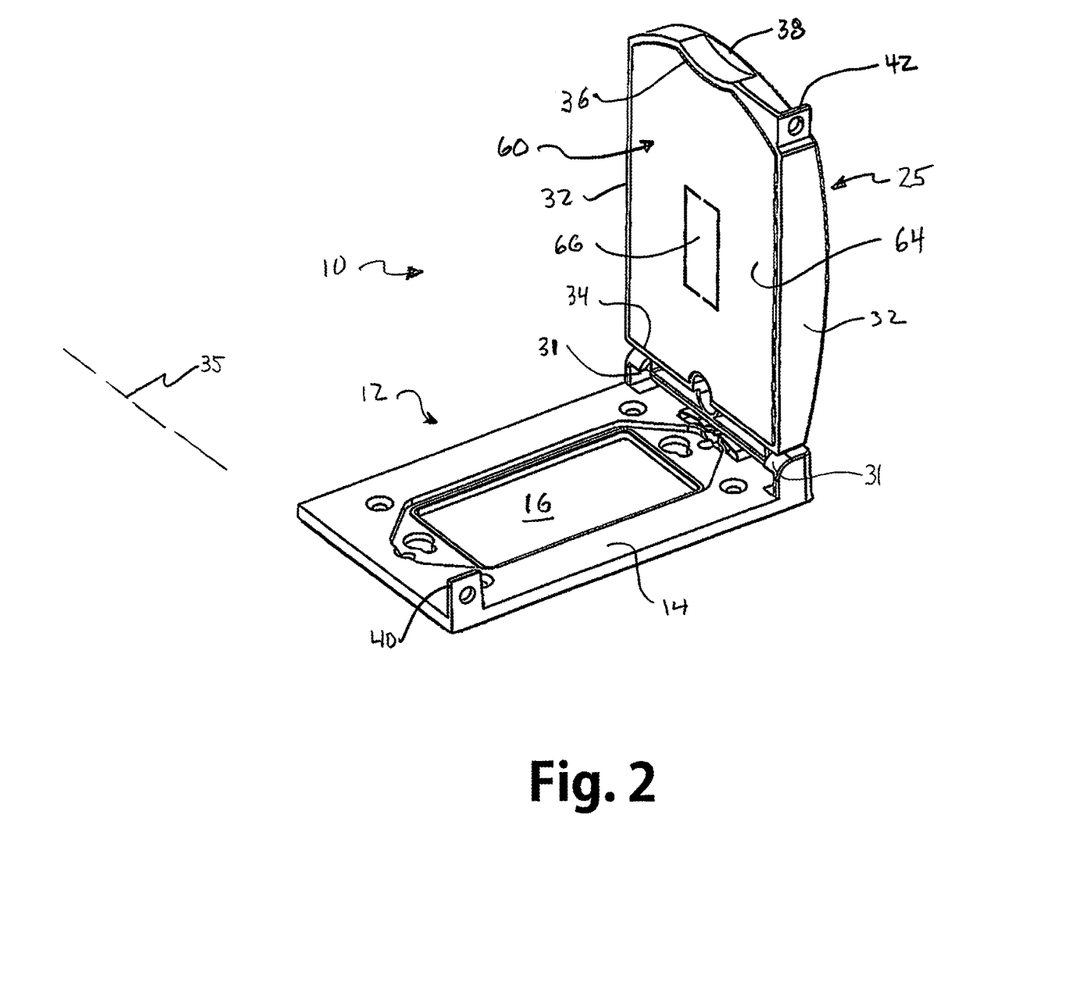
FIG. 2 an isometric view of the cover assembly illustrating a gasket nested within the lid and having a breakaway portion for accommodating a toggle switch lever.

From an examination of FIGS. 2 and 3, it will be seen that a gasket 60 is provided to seal the electrical device against water when the lid 28 is closed. The gasket 60 may be formed of natural or synthetic rubber or a suitable foam having a fluid impervious coating or layer on surfaces intended for sealing. The gasket 60 is of uniform thickness and includes a planar proximal face 64, a planar distal face 62 and a periphery congruent with that of the interior faces of the boundary skirt. As such, the gasket 60 is nested within the interior of the lid 28 with its distal face 62 abutting the proximal edges of the ribs 48, 48, 50 and 52 and its proximal face 64 flush with or extending slightly beyond the plane of the proximal edges of the boundary skirt.

When the lid 28 is closed, the proximal face 64 of the gasket 60 abuts and seals against the rear wall 14. In the event the electrical device comprises a toggle switch, the gasket 60 includes a breakaway portion 66, formed by perforations or the like. The breakaway portion 66 is removed to create an opening through the gasket 60. The opening is dimensioned to accommodate the lever of the toggle switch or a forwardly projecting member of a different electrical device. Should the lever or other projecting member extend beyond the thickness of the gasket 60, it will be accommodated within the gap or open space 56 of the grid 44, which is behind and registered with the opening.

The base 12 and lid 28 are preferably molded or cast of metal which is weather resistant and are coated with a suitable finish of protective paint. Alternately, the base 12 and lid 28 may be molded of a suitable thermoplastic.

Figure 6:
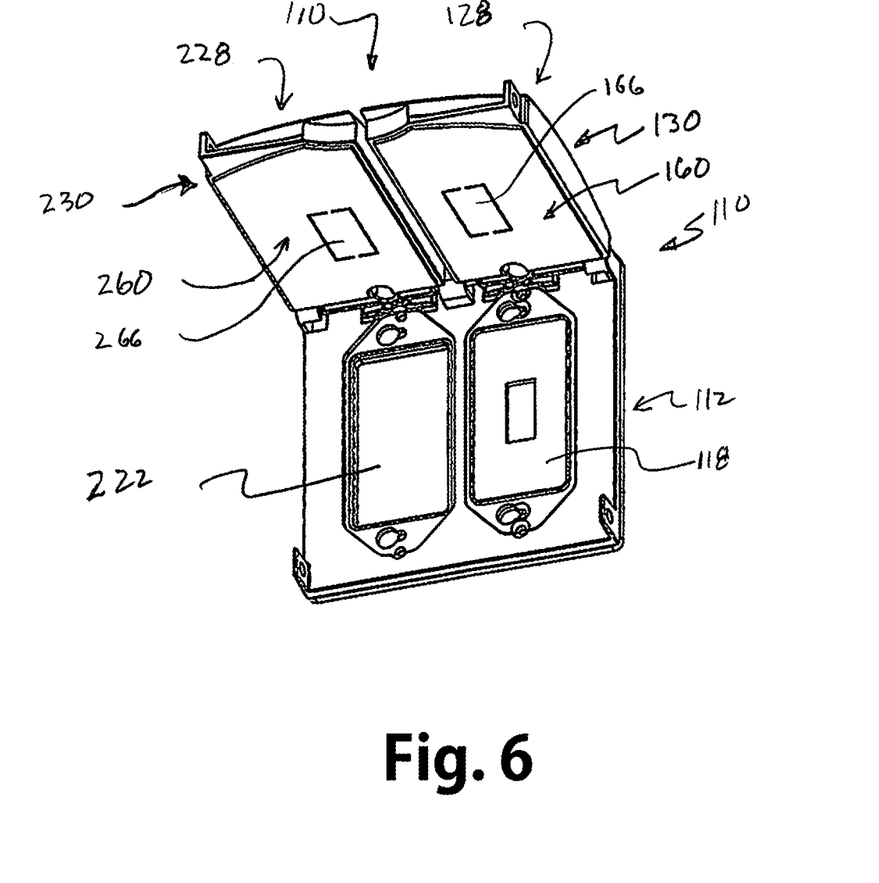
FIG. 6 is an isometric view of an alternate embodiment wherein the cover assembly is configured for use with a two electrical devices mounted in a single electrical box.

In FIG. 6 an alternate embodiment of the invention is depicted wherein a cover assembly 110 is configured for use with a two electrical devices mounted in a two gang electrical box. The cover assembly 110 includes a base 112 having a pair of side by side openings, with an adapter plate 118, 222 seated in each opening.

A pair of lids 128, 228 is hinged to the base 112 for selectively covering an electric device carried behind the respective adapter plates. The lids 128, 228 include front panels 130, 230, each having an arched or curved contour and a boundary skirt. Due to size and space considerations of a two gang electrical box, the boundary skirt periphery of the lids 128, 228 differ slightly from that of the previous embodiment.

Figure 7:
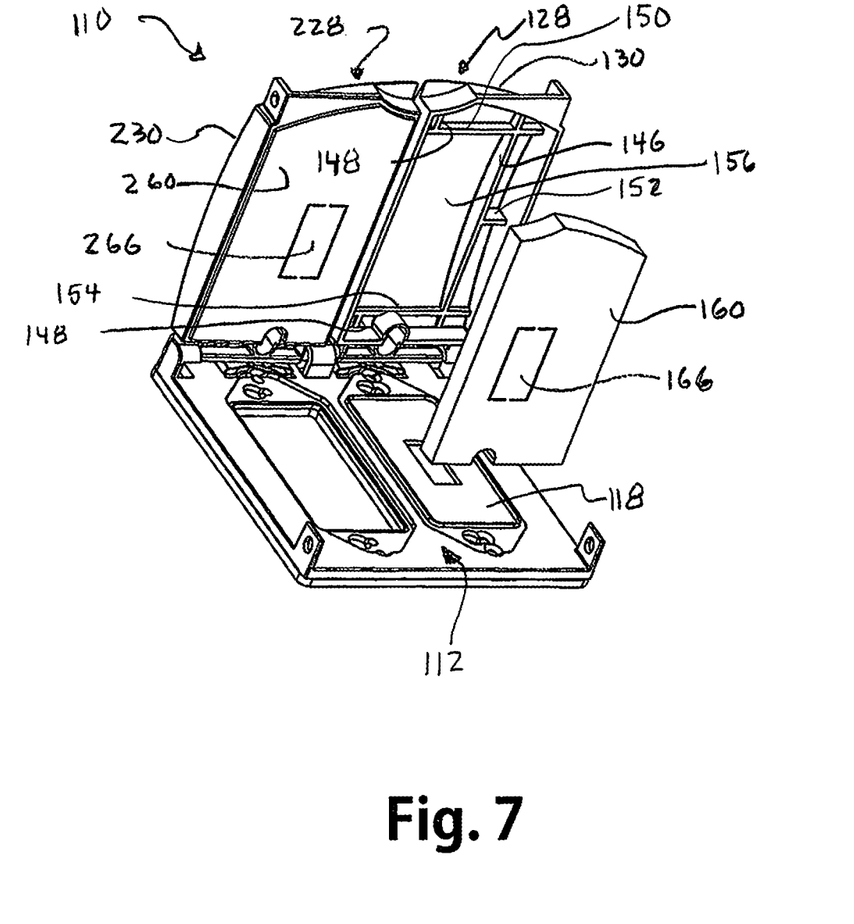
FIG. 7 an isometric exploded view of the alternate embodiment illustrating a grid of ribs extending from the underside of a lid.

In accordance with the invention, nested within the interior of the lids 128, 228 is a gasket 160, 260, respectively. The distal face of the gasket 160 abuts the proximal edges of a grid of planar ribs 146, 148, 150 and 154 which extend proximally from the underside of the curved front panel 130.

As with the previous embodiment, the grid includes a gap or open space 156 which is free of ribs and which is registered with the breakaway portion 166 of the gasket 160. The distal face of the gasket 260 abuts the proximal edges of a grid of planar ribs comprising a mirror image of the ribs illustrated in FIG. 7.

Thus it will be seen that there is provided a liquid tight cover assembly for outdoor electrical devices which achieves the various aspects, features and considerations of the present invention and which is well suited for practical use.

All publications and references cited herein are expressly incorporated herein by reference in their entirety.

In the figures of this application, in some instances, a plurality of elements may be shown as illustrative of a particular element, and a single element may be shown as illustrative of a plurality of a particular elements. Showing a plurality of a particular element is not intended to imply that a system or method implemented in accordance with the invention must comprise more than one of that element or step, nor is it intended by illustrating a single element that the invention is limited to embodiments having only a single one of that respective element. Those skilled in the art will recognize that the numbers of a particular element shown in a drawing can, in at least some instances, be selected to accommodate the particular user needs.

The particular combinations of elements and features in the above-detailed embodiments are exemplary only; the interchanging and substitution of these teachings with other teachings in this and the incorporated-by-reference patents and applications are also expressly contemplated. As those skilled in the art will recognize, variations, modifications, and other implementations of what is described herein can occur to those of ordinary skill in the art without departing from the spirit and the scope of the invention as claimed.

Further, in describing the invention and in illustrating embodiments of the invention in the figures, specific terminology, numbers, dimensions, materials, etc., are used for the sake of clarity. However the invention is not limited to the specific terms, numbers, dimensions, materials, etc. so selected, and each specific term, number, dimension, material, etc., at least includes all technical and functional equivalents that operate in a similar manner to accomplish a similar purpose. Use of a given word, phrase, number, dimension, material, language terminology, product brand, etc. is intended to include all grammatical, literal, scientific, technical, and functional equivalents. The terminology used herein is for the purpose of description and not limitation.

Having described the preferred embodiments of the invention, it will now become apparent to one of ordinary skill in the art that other embodiments incorporating their concepts may be used. Moreover, those of ordinary skill in the art will appreciate that the embodiments of the invention described herein can be modified to accommodate and/or comply with changes and improvements in the applicable technology and standards referred to herein. For example, the technology can be implemented in many other, different, forms, and in many different environments, and the technology disclosed herein can be used in combination with other technologies. Variations, modifications, and other implementations of what is described herein can occur to those of ordinary skill in the art without departing from the spirit and the scope of the invention as claimed. It is felt therefore that these embodiments should not be limited to disclosed embodiments but rather should be limited only by the spirit and scope of the appended claims.

The particular combinations of elements and features in the above-detailed embodiments are exemplary only; the interchanging and substitution of these teachings with other teachings in this and the referenced patents/applications are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto.

Having thus described the invention, there is claimed as new and desired to be secured by Letters Patent:

1. A cover assembly for an outdoor electrical device comprising a base having a planar rear panel and a lid hinged to the base, the lid including a front panel and a peripheral boundary skirt, the boundary skirt having a proximal edge lying in a first plane, the boundary skirt including a pair of straight parallel side walls, a continuous straight rear wall extending from one side wall to an other side wall and a front wall extending from the one side wall to the other side wall, an array of ribs extending from an underside of the front panel toward the first plane, the array of ribs including a first straight rib, one end of the first straight rib being joined to the front wall and an other end of the first straight rib being joined to the rear wall, the first straight rib being parallel to the side walls and a second straight rib, one end of the second straight rib being joined to the one side wall and an other end of the second straight rib being joined to the other side wall, the first and second straight ribs intersecting each other intermediate their respective ends, the ribs terminating with proximal edges lying at a second plane, the second plane being parallel to the first plane, the cover assembly further including a gasket of uniform thickness seated within the boundary skirt, a distal face of the gasket abutting the proximal edges of the ribs and a proximal face of the gasket lying in or slightly beyond the first plane, whereby when the lid is in a closed position, the proximal face of the gasket seats against the rear panel to seal the outdoor electrical device against liquid.

2. The cover assembly for an outdoor electrical device as constructed in accordance with claim 1 wherein the gasket includes a breakaway portion, the breakaway portion being removed to form an opening through the gasket, whereby in the event the electrical device comprises a toggle switch having a lever, the lever extends into the opening when the lid is closed without distortion of the gasket.

3. The cover assembly for an outdoor electrical device as constructed in accordance with claim 2 wherein the underside of the front panel includes an open space free of ribs, the breakaway portion of the gasket being in registration with the open space, whereby the lever may extend into the open space when the lid is closed.

4. The cover assembly for an outdoor electrical device as constructed in accordance with claim 2, wherein the rear panel of the base includes an opening, an adapter plate having an aperture dimensioned to receive the lever of the toggle switch being seated in the opening.

5. The cover assembly for an outdoor electrical device as constructed in accordance with claim 4, wherein the underside of the front panel includes an open space free of ribs, the opening through the gasket being in registration with the open space.

6. The cover assembly for an outdoor electrical device as constructed in accordance with claim 1, the cover assembly further including a plurality of adapter plates, each adapter plate configured with an aperture dimensioned to receive an operative face of a different electrical device and the rear panel of the base including an opening dimensioned for seating an adapter plate.

7. The cover assembly for an outdoor electrical device as constructed in accordance with claim 1 wherein the first straight rib is perpendicular to the second straight rib.

8. The cover assembly for an outdoor electrical device as constructed in accordance with claim 1 wherein the array of ribs comprises a grid including a third straight rib extending from the front wall to the rear wall, the a third straight rib being parallel to the side walls and a fourth straight rib extending from the one side wall to the other side wall, the first and the third straight ribs being orthogonal to the second and the fourth straight ribs.

9. The cover assembly for an outdoor electrical device as constructed in accordance with claim 1 wherein a contour of the front panel comprises a cylindrical segment centered about an axis which is transverse to the side walls.

10. A cover assembly for an outdoor electrical device comprising a base having a planar rear panel and a lid hinged to the base, the rear panel including an opening, an adapter plate having an aperture dimensioned to receive an operative face of an electrical device being seated in the opening, the lid including a curved front panel and a continuous peripheral boundary skirt, the boundary skirt including a pair of side walls, a rear wall extending from one side wall to an other side wall and a front wall extending from the one side wall to the other side wall, the boundary skirt having a proximal edge lying in a first plane, an array of ribs extending from an underside of the front panel toward the first plane, the array of ribs including a first straight rib, one end of the first rib being joined to the front wall and an other end of the first rib being joined to the rear wall, the array further including a second rib, one end of the second rib being joined to the one side wall and an other end of the second rib being joined to the other side wall, the first and the second ribs intersecting each other intermediate their respective ends, the ribs terminating with proximal edges lying at a second plane, the second plane being parallel to the first plane, the cover assembly further including a gasket of uniform thickness seated within the boundary skirt, a distal face of the gasket abutting the proximal edges of the ribs and a proximal face of the gasket lying in or slightly beyond the first plane, whereby when the lid is in a closed position, the proximal face of the gasket seats against the rear panel to seal the outdoor electrical device against liquid.

11. The cover assembly for an outdoor electrical device as constructed in accordance with claim 10 wherein the gasket includes a breakaway portion, the breakaway portion being removed to form an opening through the gasket, whereby in the event the electrical device comprises a toggle switch having a lever, the lever extends into the opening when the lid is closed without distortion of the gasket.

12. The cover assembly for an outdoor electrical device as constructed in accordance with claim 11 wherein the underside of the front panel includes an open space free of ribs, the opening through the gasket being in registration with the open space, whereby the lever may extend into the open space when the lid is closed.

13. The cover assembly for an outdoor electrical device as constructed in accordance with claim 11 the array further including a third rib extending from the front wall to the rear wall and a fourth rib extending from the one side wall to the other side wall, the first and the third ribs being orthogonal to the second and the fourth ribs.

14. The cover assembly for an outdoor electrical device as constructed in accordance with claim 10 wherein the curved front panel includes a contour comprising a cylindrical segment centered about an axis which is transverse to the side walls.

15. A cover assembly for an outdoor electrical device comprising a base having a planar rear panel and a lid hinged to the base, the lid including a curved front panel, the lid further including a continuous peripheral boundary skirt, the boundary skirt including a pair of parallel side walls, a rear wall transverse to the side walls, the rear wall extending from one side wall to an other side wall, the boundary skirt further including a front wall, the boundary skirt having a proximal edge lying in a first plane, an array of ribs extending from an underside of the front panel toward the first plane, the ribs terminating with proximal edges lying at a second plane, the second plane being parallel to the first plane, the array comprising a first rib, one end of the first rib being joined to the front wall and an other end of the first rib being joined to the rear wall, the array further comprising a second rib, one end of the second rib being joined to the one side wall and an other end of the second rib being joined to the other side wall, the first and second ribs intersecting each other intermediate their ends, the cover assembly further including a gasket of uniform thickness seated within the boundary skirt, a distal face of the gasket abutting the proximal edges of the ribs and a proximal face of the gasket lying in or slightly beyond the first plane, whereby when the lid is in a closed position, the proximal face of the gasket seats against the rear panel to seal the outdoor electrical device against liquid penetration.

16. The cover assembly for an outdoor electrical device as constructed in accordance with claim 15 wherein the gasket includes a breakaway portion, the breakaway portion being removed to form an opening through the gasket, whereby in the event the electrical device includes a portion projecting from the rear panel, the portion will extend into the opening when the lid is closed without distortion of the gasket.

17. The cover assembly for an outdoor electrical device as constructed in accordance with claim 16 wherein the underside of the front panel includes an open space free of ribs, the opening through the gasket being in registration with the open space, whereby the portion of the electrical device may extend through the opening and into the open space when the lid is closed.

18. The cover assembly for an outdoor electrical device as constructed in accordance with claim 16, further including a third rib extending from the front wall to the rear wall and a fourth rib extending from the one side wall to the other side wall, the first rib and third rib being orthogonal to the second rib and the fourth rib.

19. The cover assembly for an outdoor electrical device as constructed in accordance with claim 15 wherein the array of ribs comprises a grid including a third rib extending from the front wall to the rear wall, the first rib and the third rib being parallel to the side walls, the grid further including a fourth rib extending from the one side wall to the other side wall, the second rib and the fourth rib being parallel to one another, the first rib and the third rib being orthogonal to the second rib and the fourth rib.

20. The cover assembly for an outdoor electrical device as constructed in accordance with claim 15, the cover assembly further including a plurality of adapter plates, each adapter plate configured with an aperture dimensioned to receive an operative face of a different electrical device and the rear panel of the base including an opening dimensioned for seating an adapter plate.

\* \* \* \* \*